(12) United States Patent
Stanley

(10) Patent No.: US 8,497,734 B2
(45) Date of Patent: Jul. 30, 2013

(54) HIGH EFFICIENCY AUDIO AMPLIFIER SYSTEM

(75) Inventor: Gerald R. Stanley, Osceola, IN (US)

(73) Assignee: Harman International Industries, Incorporated, Stamford, CT (US)

( * ) Notice: Subject to any disclaimer, the term of this patent is extended or adjusted under 35 U.S.C. 154(b) by 25 days.

(21) Appl. No.: 13/158,250

(22) Filed: Jun. 10, 2011

(65) Prior Publication Data

US 2011/0304397 A1    Dec. 15, 2011

Related U.S. Application Data

(60) Provisional application No. 61/354,565, filed on Jun. 14, 2010.

(51) Int. Cl.
*H03F 3/38* (2006.01)
*H03F 3/217* (2006.01)

(52) U.S. Cl.
USPC .................................. 330/10; 330/207 A

(58) Field of Classification Search
USPC .......................... 330/10, 207 A, 251
See application file for complete search history.

(56) References Cited

U.S. PATENT DOCUMENTS

| | | | |
|---|---|---|---|
| 1,940,414 A | 12/1933 | Hahnle | 179/171 |
| 2,043,587 A | 6/1936 | Macalpine | 179/171 |
| 2,379,699 A | 7/1945 | Ford | 179/171 |
| 2,748,201 A | 5/1956 | McMillan | 179/171 |
| 2,751,442 A | 6/1956 | Ketchledge | 179/171 |
| 3,493,879 A | 2/1970 | Stanley | 330/17 |
| 4,390,846 A | 6/1983 | Cragfors et al. | |
| 4,516,080 A | 5/1985 | Garde | 330/3 |
| 5,347,230 A | 9/1994 | Noro | 330/123 |
| 5,657,219 A | 8/1997 | Stanley | 363/17 |
| 5,905,407 A | 5/1999 | Midya | 330/10 |
| 6,144,245 A | 11/2000 | Balogh | 327/380 |
| 6,229,389 B1 | 5/2001 | Pullen et al. | |
| 6,396,933 B1 | 5/2002 | Jung et al. | |
| 6,937,095 B2 | 8/2005 | Joffe | 330/251 |
| 7,521,936 B2 | 4/2009 | Stanley | 324/522 |

(Continued)

FOREIGN PATENT DOCUMENTS

EP    1 432 120 A1    6/2004
JP    04-189005    7/1992

(Continued)

OTHER PUBLICATIONS

European Search Report, EP 11169802.3, Aug. 25, 2011. (6 pgs.).

(Continued)

*Primary Examiner* — Steven J Mottola
(74) *Attorney, Agent, or Firm* — Brinks Hofer Gilson & Lione

(57) ABSTRACT

A high efficiency amplifier system may include multiple output stages cooperatively operating to produce an amplified output signal. The amplifier system may be used in an audio system. The amplifier system may include a non-switchmode amplifier stage cooperatively operating with a switchmode amplifier stage to generate the amplifier output signal. The non-switchmode amplifier stage may selectively enable and disable the switchmode amplifier stage to optimize efficient operation. In addition, the switchmode amplifier stage may include multiple switching stages operated with interleave. The switching stages may be controlled to balance current output of the respective switching stages based on a measured current flow in at least one of the switching stages.

19 Claims, 10 Drawing Sheets

U.S. PATENT DOCUMENTS

| | | | |
|---|---|---|---|
| 7,545,212 B2 | 6/2009 | Calmel et al. | 330/251 |
| 7,557,622 B2 | 7/2009 | Stanley | 327/131 |
| 7,579,908 B2 * | 8/2009 | Miaille et al. | 330/10 |
| 2003/0151459 A1 | 8/2003 | Leedham | 330/251 |
| 2007/0018719 A1 | 1/2007 | Seven | 330/51 |
| 2008/0088375 A1 | 4/2008 | Calmel et al. | 330/255 |

FOREIGN PATENT DOCUMENTS

| | | |
|---|---|---|
| JP | 10-242779 | 9/1998 |
| JP | 10242779 A | 9/1998 |
| JP | 2000-165154 | 6/2000 |
| JP | 2003-529994 | 10/2003 |
| WO | WO 98/37731 | 8/1998 |
| WO | WO 01/76061 | 10/2001 |
| WO | WO 2008/112041 A2 | 9/2008 |

OTHER PUBLICATIONS

"Basic Considerations and Topologies of Switched-Mode Assisted Linear Power Amplifies", H. Ertl, J.W. Kolar and F.C. Zack, IEEE Trans. on Industrial Electronics, vol. 44, No. 1, pp. 116-123, Feb. 1997.

"Novel Aspects of an Application of 'Zero' — Ripple Techniques to Basic Converter Topologies", J.W. Kolar, H. Sree, N. Mohan and F.C. Zach, IEEE Power Electronics Specialists Conf. 1997, pp. 796-803.

"Digital Amplifiers for Analog Power", J.A. Dutra, IEEE Trans. on Consumer Electronics, vol. 24, No. 3, pp. 308-317, Aug. 1978.

"Current Sensing Power MOSFETs", AND8093/D on Semiconductor, Jul. 2002.

"A Power-Efficient Audio Amplifer Combining Switching and Linear Techniques", R.A.R. van der Zee and Ed (A.J.M.) van Tuijl, IEEE Journal of Solid-State Circuits, vol. 34, No. 7, Jul. 1999.

"Active-Error Feedback and Its Application to a Specific Driver Circuit", J.R. MacDonald, IRE, pp. 808-813, Dec. 9, 1954.

"Current Dumping Audio Amplifier", P.J. Walker and M.P. Albinson, Acoustical Mfg. Co. Ltd., 5 pgs. $50^{th}$ AES Convention Mar. 1975.

"Feedforward Error Correction in Power Amplifiers", J. Vanderkooy and S.P. Lipshitz, Journal of the Audio Engineering Society, Jan./Feb. 1980 , vol. 28, No. 1/2.

"Series- or Parallel-Connected Composite Amplifiers", G.B. Yundt, IEEE Trans. on Power Electronics, vol. PE-1, No. 1, Jan. 1986.

"Precision DC-to-AC Power Conversion by Optimization of the Output Current Waveform—the Half Bridge Revisited", G.R. Stanley and K.M. Bradshaw, IEEE Trans. on Power Electronics, vol. 14, No. 2, pp. 372-380, Mar. 1999.

High Efficiency Audio Power Amplifiers design and practical use, van der Zee, Ronan, 128 pgs. Philips Semiconductors in Nijmegen, 1999.

European Serach Report for Application No. EP 11 169 802.3, dated Sep. 4, 2012, 5 pgs.

Japanese Office Action translated in English for Japanese Patent Application No. 2011-131669, 3 pgs.

Japanese Office Action translated in English for Japanese Patent Application 2011-131670, 7 pages.

European Examination Report dated Apr. 5, 2013, for European Patent Application No. 11 169 802.3, 5 pages.

\* cited by examiner

HIGH EFFICIENCY AUDIO AMPLIFIER SYSTEM

This application claims the benefit of priority of U.S. Provisional Patent Application No. 61/354,565, filed Jun. 14, 2010, which is incorporated by reference.

BACKGROUND OF THE INVENTION

1. Technical Field

The invention generally relates to audio amplifiers, and more particularly, to a high efficiency audio amplifier system.

2. Related Art

Amplifiers are utilized to amplify an input signal and produce an amplified output signal. In some applications, amplifiers operating as audio amplifiers are used to receive an audio signal as an input signal, and produce an amplified audio signal as an output signal. Amplifiers may be classified in different classes based on their operational characteristics. Example classes of amplifiers include Class A, Class B, Class AB, Class C, and Class D. Class A, Class B, and Class AB amplifiers are typically considered analog designs. Class D amplifiers are typically considered switching designs due to their switchmode operation. Class A, Class B, and Class AB amplifiers usually operate with higher losses and therefore lower efficiency than Class D amplifiers. Efficiency of operation can be a significant consideration when energy sources to power an amplifier are limited. In addition, cost of components from which the amplifier is manufactured may be a concern when designing an amplifier.

SUMMARY

A high efficiency audio amplifier may be implemented as an application specific integrated circuit (ASIC). The amplifier may be an audio amplifier that includes a first output stage coupled in parallel with a second output stage. The first output stage may be a dissipative output stage, such as a Class AB power stage. The second output stage may be a switchmode power stage, such as a current waveform optimized switchmode stage or a Class D power stage. The switchmode output stage may operate with pulse width modulation (PWM) using a pulse width modulator. The first and second output stages may cooperatively operate to drive a load with an amplified output signal. In one example, the input signal may be an audio signal, and the amplified output signal may drive a load such as one or more loudspeakers.

To obtain high efficiency operation, the first output stage may operate at any magnitude of input signal, whereas the second output stage may be selectively disabled and enabled. The second output stage may be selectively enabled and disabled based on operation of the first output stage. Control of operation of the second output stage may be based on a predetermined threshold amplitude or magnitude of the amplified output signal. During operation, when the input audio signal is absent or very small, such as during quiescent conditions, the second output stage may be disabled and the first output stage may operate independently to provide an amplified output signal. When the amplified output signal exceeds the predetermined threshold, operation of the second output stage may be enable to cooperatively operate with the first output stage. When the second output stage is enabled, the second output stage may operate with interleave to minimize ripple current in the amplified output signal. While the second output stage is enabled, the first output stage may continue to operate as an active filter to remove errors from the amplified output signal. When the input signal again drops below the threshold, the second output stage may again be disabled, and the load supplied by only the first output stage.

The second output stage may have a number of switching output stages each having a plurality of switches. The switches in the switching output stages may be operated with interleave to minimize ripple current in the amplified output signal. A modulator, such as the pulse width modulator, included in the high efficiency audio amplifier system may receive a current signal from at least one current sensor. The current signal may be indicative of a current flow in a respective at least one of the switching output stages. The current signal may be processed to provide an average of the current signal representing current flow in the switching output stages outside of a switching transition period of the switches included in each of the switching output stages. The processed current signal may be used by the modulator to control switching of the switches included in the switching output stages in order to balance an output current of each of the respective switching output stages.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Amplifiers, such as small audio amplifiers (~50 W) having cost and size sensitivities may have attributes which could be attained by use of a targeted application specific integrated circuit (ASIC). Such an ASIC may be designed to use dual power stages, such as the combined attributes of dissipative and switchmode power stages. By coupling a first output stage, such as non-switchmode output stage, in parallel with a second output stage, such as a switchmode output stage, the best attributes of both stages may be exploited to attain quality audio while minimizing the overall system cost. A dissipative power stage, such as a class-AB output stage is an output stage having at least two conductive devices operable to conduct continuously during greater than 50% of a duty cycle. In one example, the switchmode power stage may be a current waveform optimized switchmode stage, such as a class D output stage. A grounded load topology may be used to allow current sampling in the ground return of the load. A block diagram of one example of such a system is shown in FIG. 1.

Figure 1:
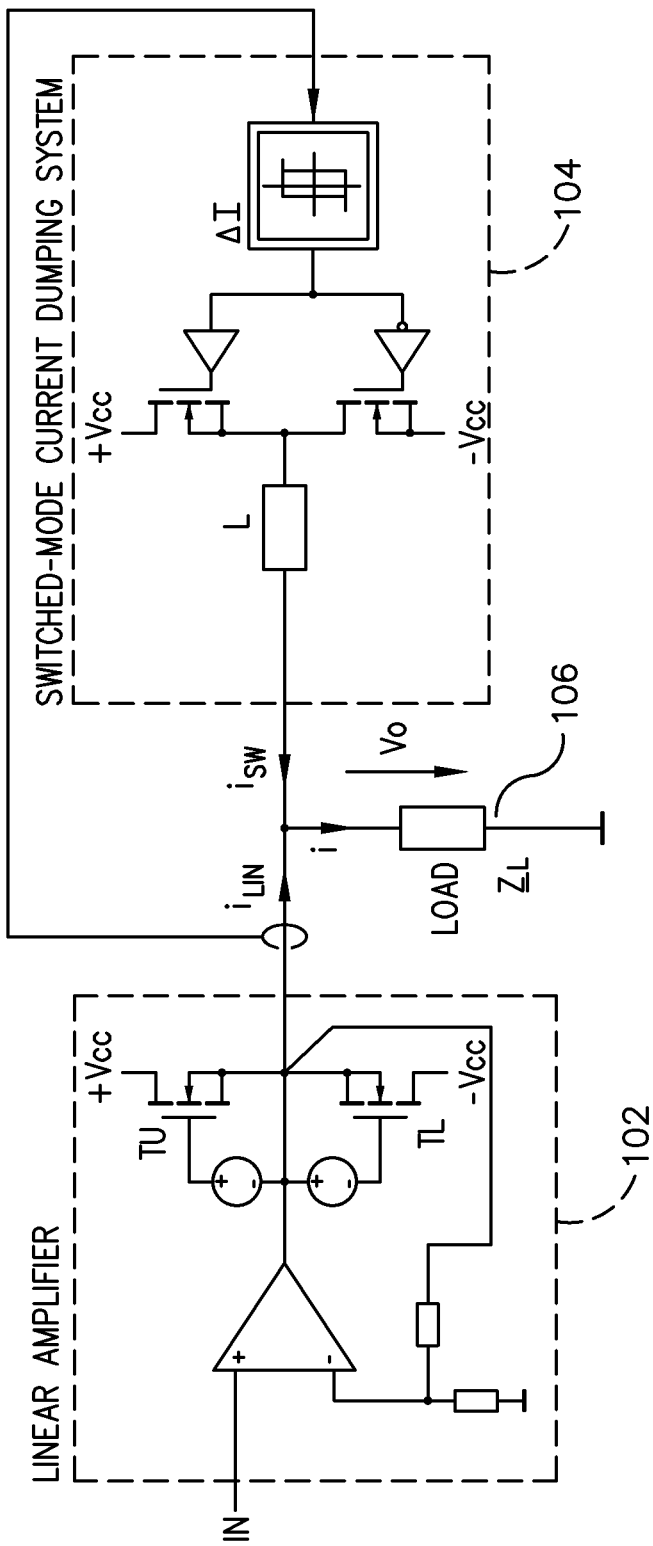
FIG. 1 is a first example audio amplifier having multiple output stages.

FIG. 1 includes a linear amplifier 102, such as an AB output stage, coupled in parallel with a switch-mode amplifier 104, such as a class D output stage. The linear amplifier 102 may generate an output current $I_{LIN}$ representative of an amplified input signal (IN), and the switch-mode amplifier may generate an output current $I_{SW}$ representative of the amplified input signal (IN), both of which are supplied to a load 106. Audio signal amplitude statistics for such a system reveal distributions that are of very high crest factor and may not be of the expected Gaussian form predicted by the Central Limit Theorem. When the audio signal has been over processed/compressed the statistics may more closely resemble Gaussian distributions. The distributions are unlikely to be identical to those of steady sine waves. The implication of such amplitude statistics is that the amplifier should not be optimized for the reproduction of steady high-level sine waves as are commonly deployed for amplifier testing purposes, but rather for the actual expected signals.

Switchmode amplifiers typically circulate a significant percentage of their full-scale output current in the main inductor of the output filter (L) during quiescent conditions. A typical value for such circulating current would be 10% of the full-scale current of the switch-mode amplifier 104. This circulating current may exceed the signal current needed much of the time and may also result in an undesirable level of quiescent power dissipation in the switch-mode stage of an amplifier such as a class-D amplifier. As a consequence, linear amplifiers, such as class-AB amplifiers, can be designed to have quiescent losses which are lower than the commonly-encountered quiescent losses of a switchmode power stage. This is particularly true if the design is a class-AB amplifier design, which is bi-polar junction transistor (BJT)—based, and not metal-oxide-field semiconductor effect transistor (MOSFET)—based, since BJTs have higher transconductances on a per-milliampere of conduction current basis. In this regard FIG. 1 does not depict an efficiency optimized design.

The linear amplifier 102 can also be viewed as an active filter that acts to remove errors from the output signal. The linear amplifier 102 can have low output impedance over an extended bandwidth allowing it to greatly improve the electromagnetic interference (EMI), distortion and audio noise behaviors of the switchmode converter 104. Since the output current ($I_{LIN}$) of the linear amplifier 102 can be the negative of the output current ($I_{SW}$) of the switchmode amplifier 104 in FIG. 1, minimization of heating in the linear amplifier 102 may require minimization of output current ($I_{SW}$) of the switchmode amplifier 104. The switchmode amplifier 104, such as a class-D current dumping converter as shown in FIG. 1 may not minimize the output current ($I_{SW}$), particularly if the ripple currents are of the order of about 10% or greater of full-scale.

Switchmode converters, or switch-mode amplifiers, may be designed that have little or no output current ripple at quiescent conditions. One approach for creating such switchmode converters is through the use of interleave. Interleave operation involves multiple switches, such as pairs of switches in a half bridge configuration. The multiple switches may be operated sequentially during a switching period to increase ripple frequency while reducing ripple magnitude. Increased ripple frequency can result in cancellation of ripple current at the switching frequency, at sidebands of the switching frequency, at odd harmonics of the switching frequency and at sidebands of the odd harmonics. One possible topology for interleave operation uses two switches and two free-wheeling diodes in a configuration known as an opposed current converter, as described in U.S. Pat. No. 5,657,219 to G. R. Stanley.

Figure 2:
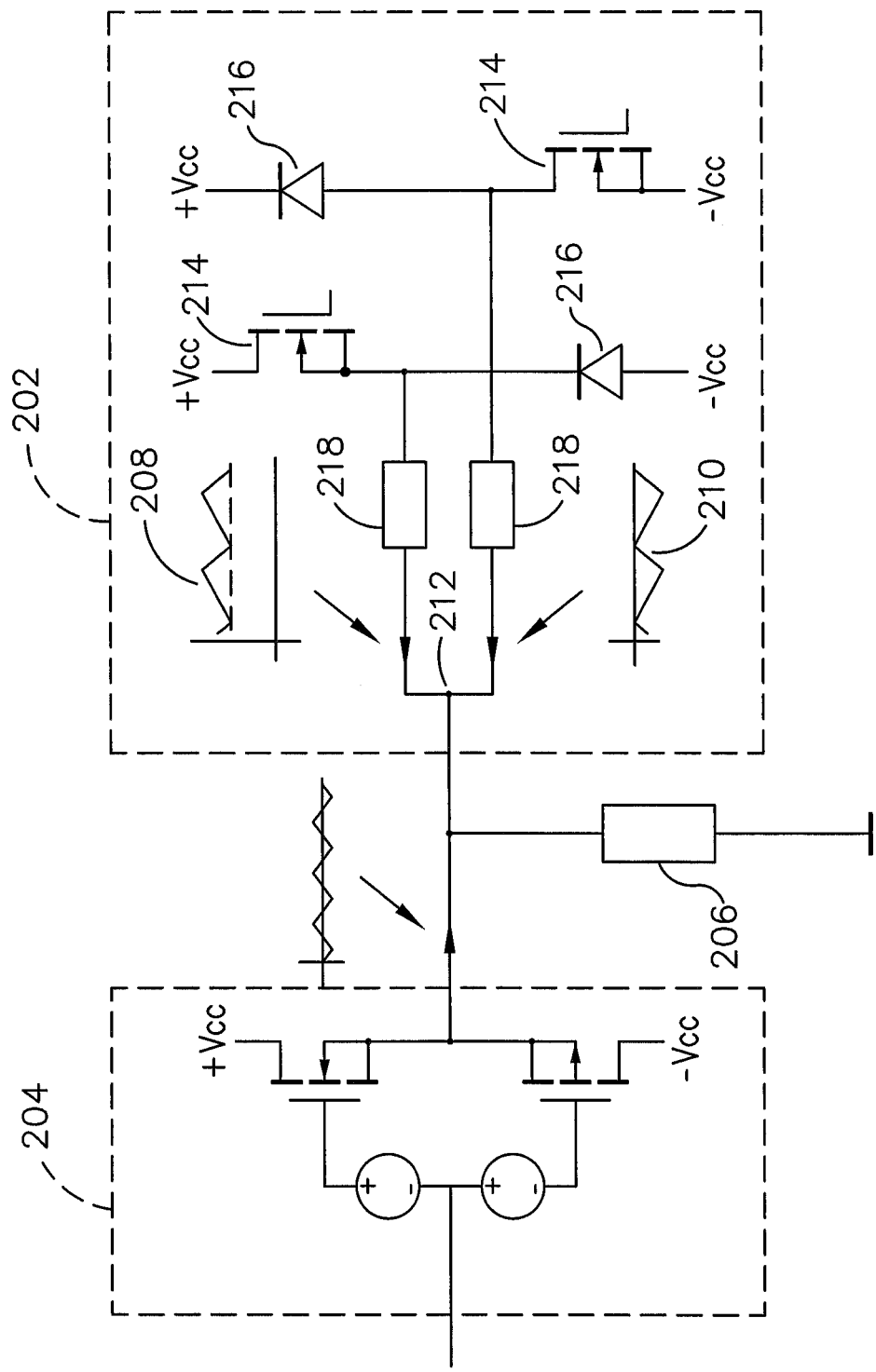
FIG. 2 is a second example audio amplifier having multiple output stages.

FIG. 2 is an example of a class-AB/D design using an opposed current converter 202 or BCA®/class-I design coupled in parallel with a non-switchmode converter 204 to feed a load 206. In other examples, other forms of converters that also produce multi-level outputs, such as by switching to unique power supplies, are possible, but may have increased implementation costs due to the need for the power supplies and extra switches, all of which should support the full current of the converter.

In FIG. 2 the interleave order N is two, which is the number of distinct phases of pulse width modulation (PWM) modulation (N=2) that are being used. FIG. 2 shows the output of the opposed current converter 202 with a net positive output signal based on the combination of a first switch mode signal 208, and a second switch mode signal 210 at an output signal node 212. The combination of the first switch mode signal 208, and the second switch mode signal 210 at the output signal node, 212 results in ramps of inductor current. The rising slopes of the inductor current of the switchmode stage 202 may be less than the falling slopes, yet when the currents are combined at the output node 212, the resulting output state is a reduced amplitude double frequency ripple current error, which the non-switchmode amplifier 204, such as a class-AB amplifier, can counter with active filtering. If the output state of the ripple current error were zero, the two inductor currents would have been substantially equal, and of opposite polarity to cancel each other. Such a relationship may require that the inductors and supply voltages be matched. Inductor matching is typically done by grading/binning to obtain parts of similar performance, and not simply by adjustments to the topology.

The example of use of an opposed current converter for the switchmode converter 202 is particularly expedient if the output voltage requirements are large since the switches 214, each formed as half-bridge cells of the opposed current converter, do not typically incur current in their body diodes, which has to be recovered. A common failure mode of a MOSFET is associated with very rapid recovery of the body diode. There may also be no fast recovery switch to execute such a recovery sequence in the converter. However, if IC processes are adequate to produce the necessary output voltage of the switchmode converter with an adequately reliable body diode function, then a design of the switchmode converter other than the opposed current converter may be used. If another design is used, the added complexity of having "active" free-wheeling devices 216, such as diodes, may not be necessary, and one possible issue that can adversely impact the opposed current converter involving the doubling of the mass of the output inductor 218 may be avoided. In the opposed current converter, the output inductor mass may be doubled since each N=2 half-bridge cell includes an inductor designed to carry the full current of the half-bridge.

Figure 3:
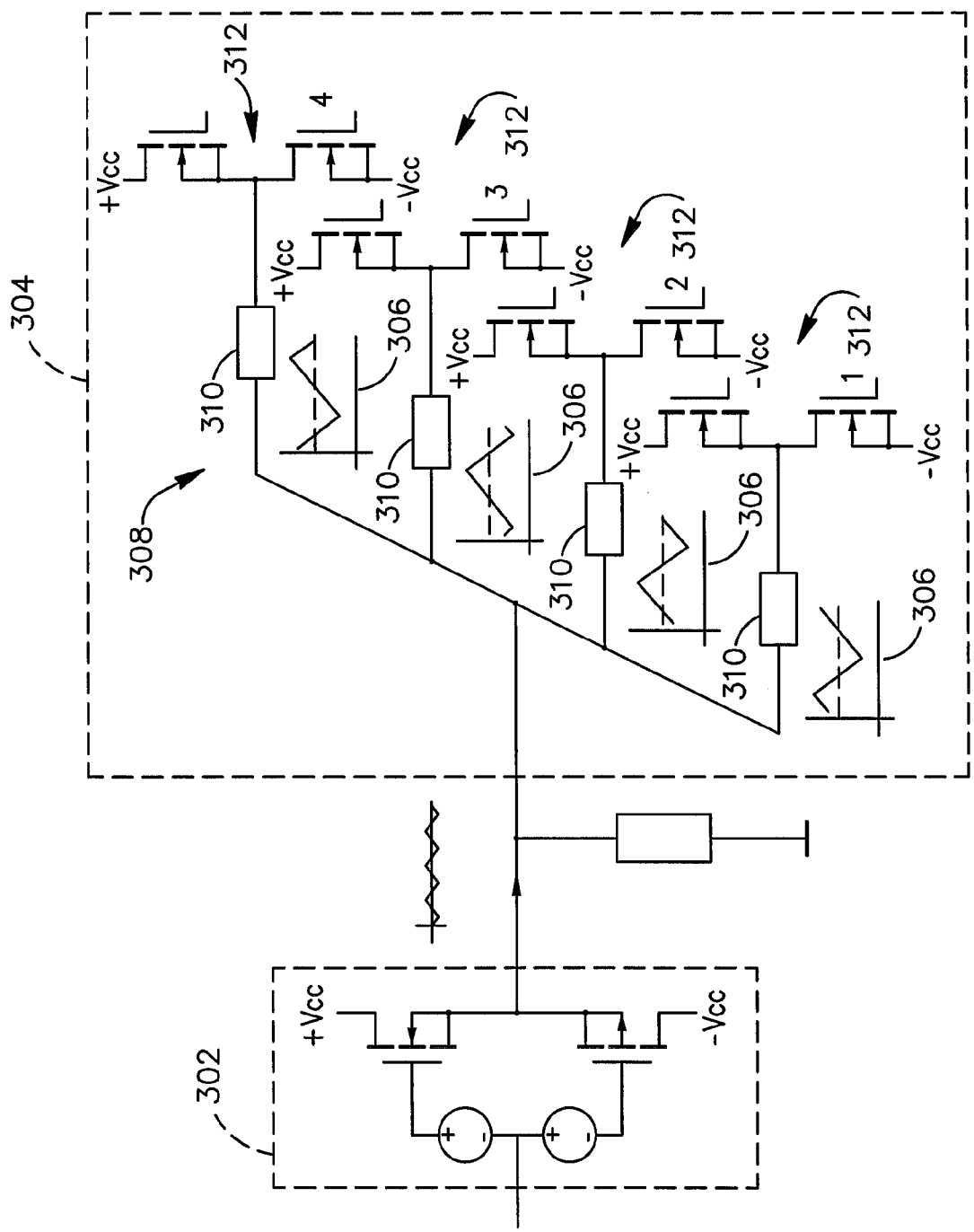
FIG. 3 is a third example audio amplifier having multiple output stages, some using interleaved operation.
Figure 4:
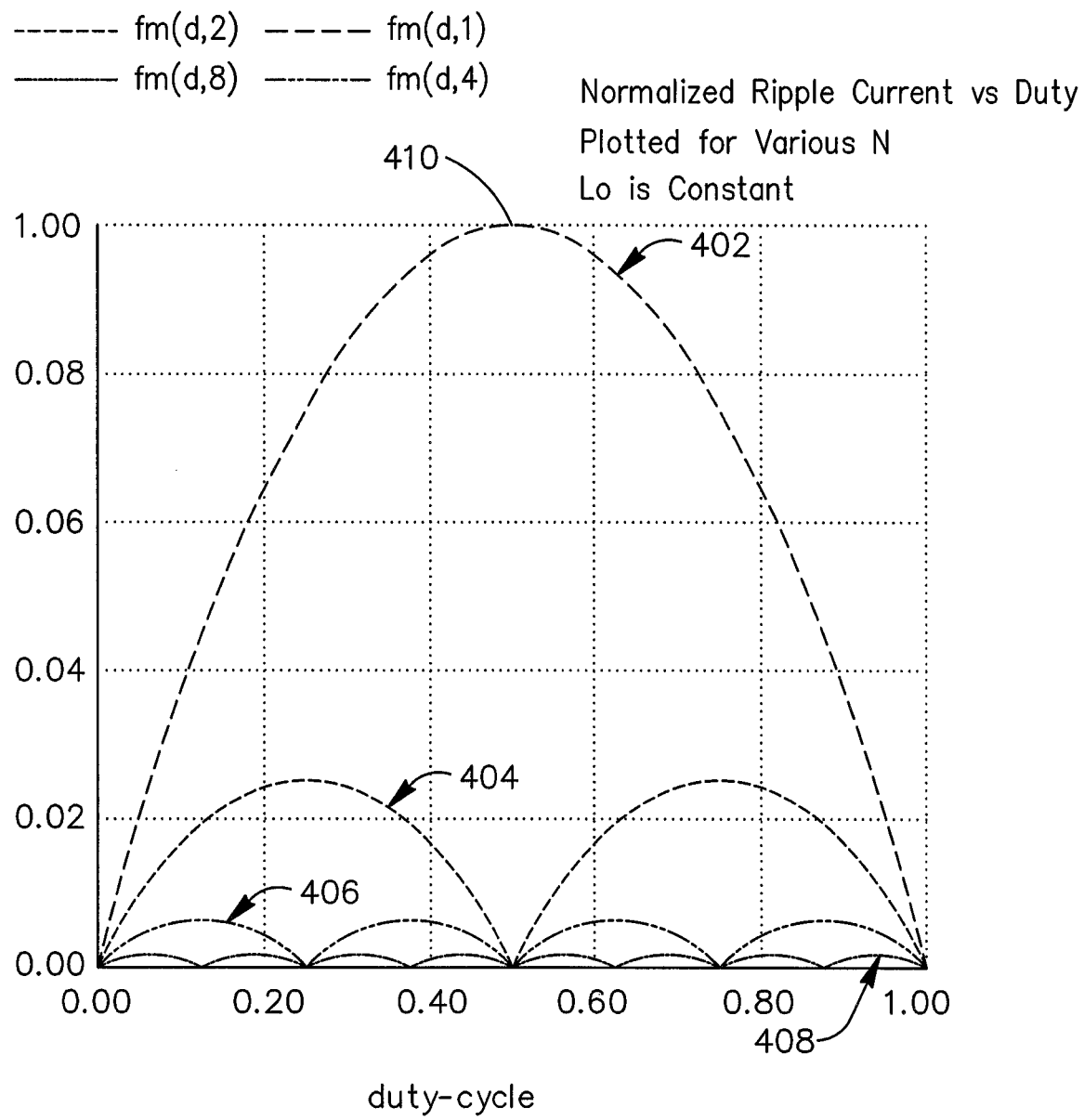
FIG. 4 is a normalized graph of peak ripple current versus duty cycle for various interleave orders of audio amplifiers.

FIG. 3 is an example of a non-switchmode converter 302 coupled in parallel with an N=4 interleaved class-D switchmode converter 304 of other than an opposed current converter design. Increasing the interleave order N reduces the current ripple error for all values of converter duty, not just at quiescent. FIG. 4 shows an example of the relationship between peak ripple current and duty cycle as further illustrated by the individual output current plots 306, where the effective output inductance 308 may be held substantially constant, independent of interleave order N. This means that the individual inductors 310 may have an inductance of $N*L_o$ where $L_o$ is the nominal output inductance of the switchmode converter 304. The current handling capability of the individual inductors 310 may be:

$$I_{max}/N \qquad \text{Equation 1}$$

where $I_{max}$ is the nominal full-scale load current. Therefore the maximum energy stored in each inductor is:

$$L_o*I_{max}^2/(2*N) \qquad \text{Equation 2}$$

which shows that the total energy stored in the inductors 310 is not affected by N and thus the total volume of magnetic material in the output inductor system may be a constant. In FIG. 3, each of the four output stages 312, or switching stages is a half bridge circuit. Any number of switching stages may be included, thus, use of the term "switching stage" or "output stage" should be construed as one or more switching stages or output stages.

FIG. 4 is an example normalized graph of peak ripple current versus duty cycle for various interleave orders of audio amplifiers. In FIG. 4, the functions of ripple fm(d,N) are plotted for interleave operation of N=1, 2, 4 and 8. Namely, interleave order N=1 is fm(d,1) 402, interleave order N=2 is fm(d,2) 404, N=4 is fm(d,4) 406, and interleave order N=8 is fm(d,8) 408. In other examples, any other value of N may be used. Note that there are always N+1 nulls in the ripple current vs duty functions. For the N=1 (non-interleaved) case the ripple current is maximum 410 at about 50% duty (0.50), a very undesirable circumstance. When the modulation saturates at 0% or 100% duty, the ripple current may always be substantially zero independent of N. The worst-case ripple current may be about mid-way between nulls which evenly divide the duty axis. The worst case ripple current may be inversely proportional to $N^2$, which in FIG. 4 is the cause of the N=8 ripple current peaking at only $1/64^{th}$ of the N=1 ripple current. The frequency of the ripple is:

$$N*F_s \qquad \text{Equation 3}$$

where $F_s$ is the switching frequency. The effect of different frequencies may not impact the dissipation of ripple current by the non-switching stage, such as an AB-class stage, but may improve the filtering effectiveness of passive low-pass filters included in the amplifier. The signal to drive the switchmode converter may be the output current of the non-switching stage, such as an AB stage. The minimization of this current may be synonymous with maximum efficiency.

Figure 5:
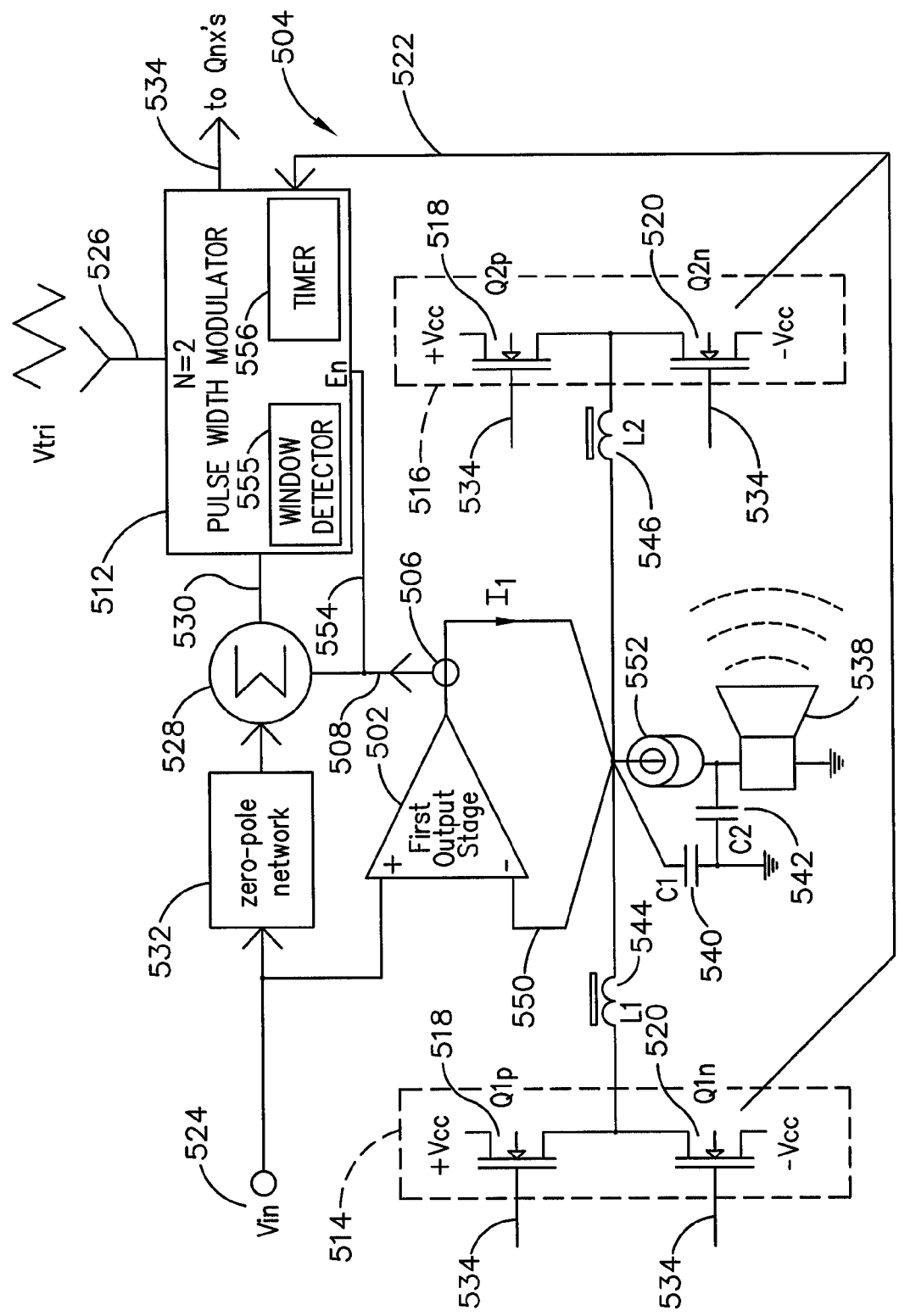
FIG. 5 is a fourth example audio amplifier with output stages operated with interleave of N=2.

FIG. 5 shows an example N=2 AB/D stage amplifier. In FIG. 5, a first output stage 502 may be coupled in parallel and cooperatively operate with a second output stage 504. The first output stage 502 may be a linear amplifier, such as an AB stage power converter, having at least two conductive devices operable to conduct continuously during greater than 50% of a duty cycle of the at least two conductive devices. In the example of FIG. 5, a current sensor 506 may sense an output current ($I_1$) of the first output stage 502 and provide a current error signal on an error signal line 508 to a pulse width modulator 512 included in the second output stage 504.

The pulse width modulator 512 may be any form of switching control device capable of outputting signals to operate a plurality of switches included in the second output stage 504 as described later. The pulse width modulator 512 may include hardware modules, software modules, or some combination thereof executable by a processor. Software modules may include instructions stored in a memory, or other memory device that are executable by the processor. Hardware modules may include various devices, components, circuits, gates, circuit boards, and the like that are executable, directed, and/or controlled for performance by the processor. The memory may include computer readable storage media such as various types of non-transitory volatile and non-volatile storage media, including but not limited to random access memory, read-only memory, programmable read-only memory, electrically programmable read-only memory, electrically erasable read-only memory, flash memory, magnetic tape or disk, optical media and the like. In one example, the memory may include a cache or random access memory for a processor. In alternative examples, the memory may be separate from a processor, such as a cache memory of a processor, the system memory, or other memory. The memory may be an external storage device or database for storing data. Examples include a hard drive, compact disc ("CD"), digital video disc ("DVD"), memory card, memory stick, floppy disc, universal serial bus ("USB") memory device, or any other device operative to store data. The memory may be operable to store instructions executable by a processor.

In FIG. 5, the second output stage 504 includes a first output stage, or first switching stage 514 and a second output stage, or second switching stage 516. In FIG. 5, each of the first and second switching stages 514 and 516 may be half bridge switching stages that include a first switch 518 (positive switch) cooperatively operable with a second switch 520 (negative switch). In other examples, a full bridge, or any other configuration of the switches are possible. The switches may be controlled with the pulse width modulator 512 to generate an amplified signal representative of an amplified version of an input signal (Vin) 524 based on a pulse width modulation signal output by the pulse width modulator 512. In addition to the current error signal on the error signal line 508, the pulse width modulator 512 may use a feed-forward triangled level control signal (Vtri) provided on a triangle signal line 526 to hold a system gain of the second output stage 504 substantially constant. The current error signal may be provided to a summer 528, which is also supplied with the input signal 524 after the input signal 524 is processed through a zero-pole network 532, as described later. The summation of the processed input signal 524 and the error signal may be provided as a feed forward control signal 530 to the pulse width modulator 512. Switch control signals to selectively enable and disable the first and second switches 518 and 520 in each of the first and second switching stages 514 and 516 may be output by the pulse width modulator 512 on PWM signal lines 534 when the pulse width modulator 512 is enabled.

The derivations of the feed forward control signal 530 for the pulse width modulator 512 of the second output stage 504 may not rely on only the current error signal from the first output stage 502, as this can imply that the current error signal may be larger than absolutely necessary. Since the intrinsic gain of both the first output stage 502 and second output stage 504 are known, an optimized design may be one in which the input signal 524 is fed-forward to the pulse width modulator 512 through the summer 528 as an expected nominal input to the pulse width modulator 512. In other examples, other forms of feedforward or feedback control are possible.

Furthermore, in FIG. 5, the gain of the second output stage 504 (switchmode stage) may encounter a phase lag and roll-off in an output filter. The output filter may include a load 538, such as for example, one or more loudspeakers. In addition, the output filter may include a portion of the second output stage 504 that may include filter capacitances C1+C2 540 and 542, and a first inductor L1 544 in parallel with a second inductor L2 546. In other examples, the load 538 may be omitted or assumed to be at a predetermined value within the output filter. To the extent that the load 538, such as one or more loudspeakers, is known, the effects of the output filter can be compensated in the feed-forward signal to the pulse width modulator 512. In one example, the zero-pole network block 532 may be used to compensate the feed forward signal provided to the pulse width modulator 512. Also placing such a low-pass pole network in the signal path to the first output stage 502 may result in a similar efficiency improvement, but could require inverse equalization elsewhere to correct small system response roll-off created. In other examples, the zero-pole network block 532 may be omitted.

The current sensor 506 may perform current sensing of the first output stage 502 with any form of current sensing device. The current sensing device may not need to be extremely accurate since the main feedback loop that governs output fidelity of the amplifier is a voltage feedback loop 550 that encloses the first output stage 502. The accuracy of the sensing, however, may impact the efficiency of the amplifier. Noise and distortion generated within the current sensor 506 may largely be countered by the first output stage 502. The required dynamic range of current sensing may also be compressed by the limited current required of the first output stage 502. The current error signal of the current sensor 506 may be provided as an error signal to the second output stage 504 (switchmode converter) instead of being a drive signal of the switches 518 and 520 in the switchmode converter.

In FIG. 5 the output inductors L1 and L2 544 and 546 need not be extremely linear and likewise the capacitors C1 and C2 540 and 542 can be relatively non-linear devices, such as X7R ceramics, due to the filtering effects of the first output stage 502. This may minimize the cost and size of these filter components. To effect high frequency electromagnetic interference (EMI) containment, the first output stage 502 may not be able to contain the very high frequency (VHF) signal content coupled to the output by parasitic capacitance within inductors L1 and L2 540 and 542. Accordingly, a small inductor 552, such as an inductor bead may be included in the design as added filtering to contain any VHF signal content that may be present as part of the output signal of the amplifier.

In the example N=2 pulse width modulator 512, a control signal, such as the single synthesized triangle waveform (Vtri) present on the triangle signal line 526 may be used. The single synthesized triangle waveform may be used in certain topologies, such as when the second output stage 504 is constructed with analog PWM synthesis techniques. Digital PWM synthesis is also possible. Digital PWM, however, may not be cost effective when the input signal to the modulation process is an analog error signal from an analog version of the current sensor 506. In other examples, a digital error signal may be used. The accuracy demands on the digital or analog PWM synthesis may be somewhat relaxed due to correction (filtering) of the output signal of the second output stage 504 by the first output stage 502, which may override some synthesis errors. Correction of the output signal of the second output stage 504 may be performed due to the output signal of the first output stage 502 being combined with the output signal of the second output stage 504.

In FIG. 5, the pulse width modulator 512 of the second output stage (the switch mode stage) may receive the current error signal from the current sensor 506 included in the first output stage as an enable signal 554. Since the output impedance of the second output stage 504 may be relatively high when not operating (or operating around quiescent conditions, i.e. little or no load), operation of the second output stage 504 may be selectively disabled by the pulse width modulator 512 based on the enable signal 554. Enablement and disablement of the second output stage 504 via the pulse width modulator 512 may be based on a predetermined threshold of the current output by the first output stage 502. For example, when the current on the error signal line 508 exceeds a predetermined magnitude due to the load 538 being supplied by only the first output stage 502 increasing above a threshold, the second output stage may be enabled and supply an amplified output signal to the load 538. Once the second output stage 504 is enabled and produces the amplified output signal, the first output stage may take on a filtering role of the output signal of the first output stage, instead of driving the load 538 with the amplified output signal, such as what may occur during quiescent, or low load conditions. As a result of disabling the second output stage 504 during quiescent or low load conditions, power consumption by the second output stage 504 for small signal currents may be substantially reduced.

Operation of the second output stage 504 may be enabled and disabled based on a predetermined threshold of the current error signal. Since the second output stage 504 is operated by the pulse width modulator 512 as an interleaved power stage, the second output stage 504 can be started substantially immediately upon being enabled, with minimum transient output error currents. In one example, to allow substantially immediate starting of the second output stage 504, power supply potentials (+Vcc and −Vcc) may be continuously present on the second output stage 504. Continuously present power supply potentials may also include gate driver potentials of each of the half bridges 514 and 516 included in the second output stage 504.

In one example, pulse width modulated operation of the second output stage 504 may be an all or nothing matter based on the predetermined threshold. Thus, reduced total duty (high deadtime) of the second output stage may be avoided. Alternatively, the second output stage may be operated within a range of operation in combination with the enable signal 554 to suspend and initiate operation of the second output stage 504. Varying total duty operation may be based at least in part on the current error signal provided via the summer 528 from the first output stage 502. Operation of the second output stage 504 with varying total duty may also include operation in a portion of the range of operation with interleave control of the switching stages, and a portion of the range of operation without interleave control of the switching stages. Since non-linear operation of the second output stage 504 may result in a requirement for more error correction by the first output stage 502, in order to minimize losses in the first output stage 502, interleaved operation of the second output stage 504 may occur at larger amplified output signals. For example, low total duty may be implemented in a non-interleaved mode of operation of the second output stage 504, wherein ripple induced losses could be moderated by filtering with the first output stage 502. In other integrated circuit designs, interleave and minimum losses may be achieved with only the enable signal to selectively disable and activate operation of the second output stage 504.

In one example, modulation of the second output stage 504 may be performed synchronously on a triangle frequency $F_s$ related clock edge of the triangle signal (Vtri) supplied on the triangle supply line 526. The triangle frequency may be the frequency of at which the triangle wave Vtri is generated. Synchronous performance of modulation of the second output stage 504 may be optimum at the vertex of the triangles generated in the triangle wave Vtri. Synchronous modulation may be performed using a PWM enabled window detector 555 included in the pulse width modulator 512. In addition, the second output stage 504 may be disabled synchronously by the PWM enable window detector 555 on a clock edge of the triangle signal Vtri after some pre-determined or pre-chosen period of time delay provided by a timer 556 included in the pulse width modulator 512, as further described later.

The timer 556 may be a resettable timer in the form of any circuit, device or set of instructions capable of commencing counting for a predetermined period of time upon occurrence of one or more events, and being reset to again commence counting for the predetermined period in response to receipt of a reset signal. One example strategy for enabling and disabling the second output stage 504 may be to implement a timer 556 that initiates timing upon enablement of the second output stage 504. The timing of the timer 556 may represent the minimum amount of time that the second output stage 502 may remain enabled. The timer 556 may be reset by a reset signal triggered by an event or signal. In one example, the timer 556 may be reset and again begin timing for the predetermined period of time each time the output current of the first output stage increases in magnitude above a predetermined magnitude of output current. Alternatively, or in addition, the timer 556 may be reset and again begin timing for the predetermined period of time each time a demand signal of a load supplied by the high efficiency amplifier increases in magnitude above a predetermined magnitude, and/or in response to the input signal (Vin) 524 exceeding a predetermined magnitude. Alternatively, or in addition, the timer 556 may be reset and again begin timing for the predetermined period of time each time an output current of the first output stage 502 exceeds a predetermined magnitude of output current for a predetermined period of time. In still other examples, any other signal indicative of loading of the amplifier exceeding a predetermined threshold may be used to reset the timer 556.

The timer 556 may establish a predetermined period of time has elapsed based on a clock, a pulse count, a periodic signal, or any other mechanism or strategy for obtaining repeatability of the predetermined period of time. An example strategy for enabling and disabling the second output stage 504 may be to implement a timer 556 that can count out a predetermined number of $F_s$ clock cycles of the triangle wave (Vtri) after the last occurrence of threshold level stage currents on either the first output stage 502, or the second output (PWM output) stage 504. In other examples, any other timing scheme may be used to obtain the desired result.

Having sustained operation of the second output stage 504, such as a switchmode amplifier, or the first output stage 502, such as an AB amplifier, for a predetermined period of time, such as about 10 mS to about 20 mS, after the last occurrence of threshold level stage currents can mask or otherwise eliminate audible artifacts in the output signal resulting from switching on and off the second output stage 504. For example, any low-level noise artifacts associated with enabling the second output stage 504 may be suppressed or eliminated from being audible by the PWM enable window detector 555. Other mechanisms and methods for enabling and disabling of the switching of the second output stage 504 may also be implemented, such as suppressing the disabling of the switching based on window detecting the signal voltage of the input signal (Vin) 524, or an output voltage of the first output stage 502.

Figure 6:
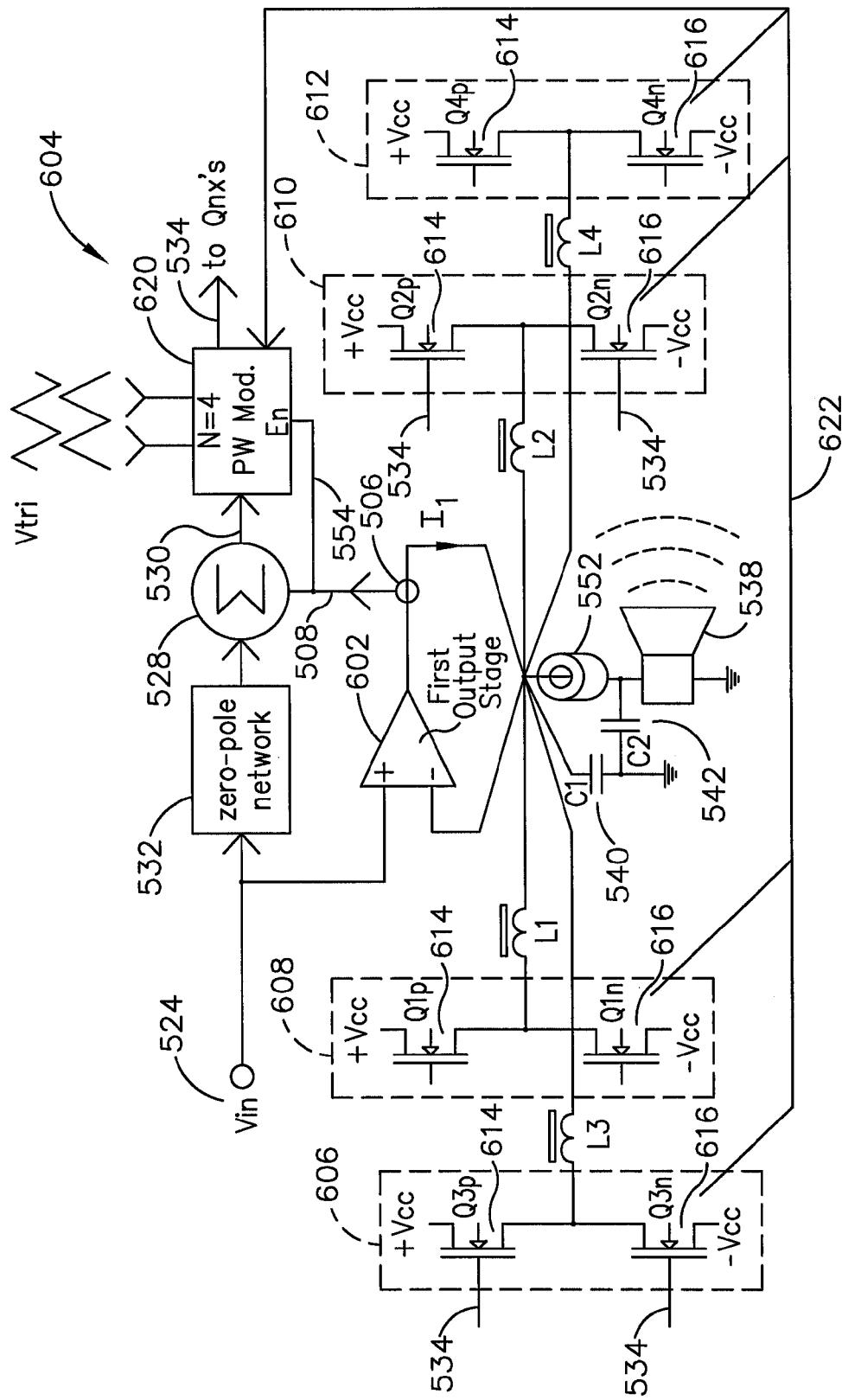
FIG. 6 is a fifth example audio amplifier with output stages operated with interleave of N=4.

FIG. 6 is another example high efficiency amplifier that includes a first output stage 602, such as a linear amplifier, and a second output stage 604. In FIG. 6, the second output stage is a switchmode converter that is an N=4 class-D stage. Thus, the second output stage 604 may include a first output stage, or first switching stage 606, a second output stage, or second switching stage 608, a third output stage, or third output switching stage 610 and a fourth output stage, or fourth switching stage 612 cooperatively operable as switching output stages of the second output stage 604. Each of the switching output stages 606, 608, 610 and 612 may include a first switch 614 and a second switch 616 operating as positive and negative switches (Qnp and Qnn), respectively. In other examples, any number of switching output stages may be included in the second output stage 604. For purposes of brevity, the discussion of FIG. 6 will mainly discuss differences between FIGS. 5 and 6.

In the examples of FIGS. 5 and 6 the switches may be MOSFETs implemented in an integrated circuit (IC) in an output switching configuration, such as a half bridge configuration. In these examples, the MOSFET active areas may be a constant related to the required output current. Just as the total inductor volumes may not be dependent on N, as previously discussed, neither is total FET area of the MOSFETS in an IC implementation. In FIG. 6, due to the interleave N=4 design, two triangle waveforms (Vtri) that are in quadrature may be synthesized by a pulse width modulator 620.

As the interleave number N increases, the ripple current is decreased allowing the volume of the inductors (L) to become smaller. In one example, the inductors (L) may become small enough to be of highly automated assembly. For example, in FIG. 6, if the illustrated N=4 configuration were to have a full-scale output current of 5 A, then each inductor (L1, L2, L3, and L4) would need to have about a 1.25 A full load capability with less than perfect linearity due to the filtering by the first output stage 602. In FIG. 6, if, for example, rail supply voltage Vcc were 35V and the inductor ripple current were set to 125 mA peak when operating at 384 KHz (arbitrary choices) the necessary inductance of the inductors (L1, L2, L3, and L4) would be about 182 μHy. A beneficial property of reducing inductor volume is that the mountings of the inductors become increasingly self-sufficient without there being mechanicals added to the inductors, and the surface area over volume ratio of the inductors may be improved resulting in improved cooling capability during operation. In other words, inductors having smaller inductor volume cool more efficiently.

With interleaved operation of the switching stages 606, 608, 610 and 612 of the second output stage 604, a current sharing technique may be implemented to keep the switching stages 606, 608, 610 and 612 sharing current substantially equally. In other words, the output power of each of the switching stages 606, 608, 610 and 612 may be balanced. In FIG. 5, operation of the switching stages 514 and 516 may also be balanced. Some form of power output indication of each of the switching stages, such as a current feedback may be used to provide such a function.

In FIG. 6, current in one or more of the switching stages 606, 608, 610 and 612 may be sensed by a current sensor. The current sensor may be any form of sensing circuit or device capable of sensing current flow in the switching stages 606, 608, 610 and 612. The current feedback is depicted in FIGS. 5 and 6 by interconnecting a current balance line 522 and 622, respectively, that provides current information in the form of current balance signals from the individual low-side, or negative switch MOSFETs 520 and 616 back to the pulse width modulator 512 and 620, since in this example, it is the low side switch MOSFETS 520 and 616 that are operating as current sensors. For purposes of brevity, the remaining discussion will mainly reference FIG. 6, however application of the discussion to the example configuration of the N=2 configuration of FIG. 5 or any configuration of greater than N=4 is possible.

In FIG. 6, the matching of the impedance characteristics of the switching stages 606, 608, 610 and 612 and accuracy of modulation of the switching stages 606, 608, 610 and 612 that is readily possible in an IC provides some amount of current balancing during operation, with the current balance feedback signals providing additional current balancing via the pulse width modulator 620 operating as a current balancing modulator.

In FIG. 6, the low-side switch MOSFETs 616 are operating as current sensors to be the source of the balancing information. In at least some examples, the current sensor may be a MOSFET, however, in other examples, any other form of power output sensing of the switching stages is possible. Using a MOSFET, a sense FET construction may be used in which some MOSFET cells are source disconnected from the main FET and used to sample current. This connection may be made with N-channel FETs on the low-side FETs 616 of each of the switching stages 606, 608, 610 and 612. The high side N-channel FETs 614 can also be sampled with drain disconnected MOSFET cells, but there may be switching voltage noise from the current samples and additional level shifters may be required to minimize switching noise. It may be possible to use the same signals as are created for the high-side current limiting of the protection circuitry, but it may also be possible to extract the necessary information for balancing using only the low-side switches 616.

The current information used to balance two or more substantially identical switching stages included in the second output stage 604 may be substantially monotone (steadily increasing or decreasing in amplitude), as a function of the unbalance current sensed in the switching stages 606, 608, 610 and 612, and substantially equal in value for all of the compared switching stages 606, 608, 610 and 612. High linearity and low temperature sensitivities may not be required of the current balance signals 622. Provision of the current balance information for use in the feedback control loop does not need to be extremely fast in comparison to, for example, provision of overcurrent protection information to an overcurrent protection module included in the high efficiency amplifier. Accordingly, the basic time constant of the unbalance current mesh may be relatively long. In one example, the time constant may be derived by the equation:

$$2*L_x/(2*R_{ps}+2*R_L) \qquad \text{Equation 4}$$

where $L_1$ is the value of inductors $L_1$ $L_2$, $L_3$ or $L_4$, $R_L$ is the resistance of the inductors $L_1$ $L_2$, $L_3$ or $L_4$, and $R_{ps}$ is the effective output resistance of the second output stage 604. $R_{ps}$ is the time average of the resistance of the drain to source MOSFET switches ($R_{ds}$) 614 and 616, and the resistance of the body diode of the MOSFETs 614 and 616 plus another term ($R_0$) related to the switching event.

The feedback control loop may leverage the slowness of the time constant of the unbalanced current mesh to enable use of a desirable delay in receipt of the high-side current of a switching stage by the pulse width modulator 620. In other words, the high side current need not be instantaneously available to the pulse width modulator 620 as a current feedback signal to manage the control loop. Instead, the pulse width modulator 620 may include a blanking function. The blanking function may purposefully delay receipt of high side current during a switching event to avoid sensing transitory currents that may be present as the low side switch 616 opens, and the high side switch 614 closes. These transitory currents may be due to the shoot-thru currents that occur during recovery of the body diode in the MOSFET negative switch 614. Waiting and "extracting" the free-wheeling body-diode current signal in the low-side sense FET from the feedback current information may also suffice to balance the currents of the high-side FETs 614, or vice-versa. If the body diode recovery current tail time interval of the sense FET is excluded from the observation, whenever forward current is increasing in one power FET 614 or 616 the forward current may be diminishing in the other power FET 614 or 616 of a switching stage. This allows the current sensed in the low-side sense FET included as part of the low side MOSFET 616 to be monotone as a function of power stage current imbalance of the second output stage 604. In other words, the current information sensed in the low-side sense FET may be seen by the pulse width modulator 620 as changing with a substantially constant or continuous slope due to the omission of the transitory shoot-thru currents from the feedback current information. The current information signal provided by the low side MOSFETs 616, however, may not be linear since the body diode of the low-side sense FET does not constitute a linear resistance as does the low-side power FET drain-source channel resistance $R_{ds}$.

Use of the current information found with the low-side sense FET may be due to the ability to remove the signal corruption that may occur when shoot-through currents occur during recovery of the free-wheeling diodes that are formed by the body diodes of the power stage FETs 614 and 616. These shoot through currents represent current sampling error, which is highly temperature sensitive and not simply proportional to load current or its unbalance between switching stages. Thus, omission of these shoot through currents from the current information used by the pulse width modulator 620 when balancing the output power of the switching stages 606, 608, 610 and 612 may substantially eliminate current sampling error.

The pulse width modulator 620 may include a blanking capability to omit the shoot thru currents of the switching stages. The blanking capability may be used by the pulse width modulator 620 to ignore the current information provided by the low-side power FET during switching transitions. In one example, the pulse width modulator 620 may include a buffer. The buffer may be used by the pulse width modulator 620 to store current information prior to a switching event of the first and second switches 614 and 616 that results in shoot-thru currents. During the switching event, the pulse width modulator 620 may use the buffered current information to perform the feedback control. Thus, the diode recovery interval of the low-side power FET may be disregarded by the pulse width modulator 620. In other examples, the pulse width modulator 620 may disregard the diode recovery interval using a timer, a substituted value, averaging of the current information, filtering, or any other mechanism or procedure to minimize or eliminate the current information during a switching event.

As such, average current measurements absent any shoot through currents due to diode recovery during the switching transition period may be provided as the resulting feedback current information signal. Sensing the switch currents while blanking the diode recovery current intervals may improve the accuracy of the current balance information provided as the feedback signal resulting in optimized current balance control in pairs of switching stages. The switch current balance system and modulator may be used in any form of switchmode converter and is therefore not necessarily limited to a particular combination of a first output stage 602 and a second output stage 604, such as an AB/D amplifier.

Figure 7:
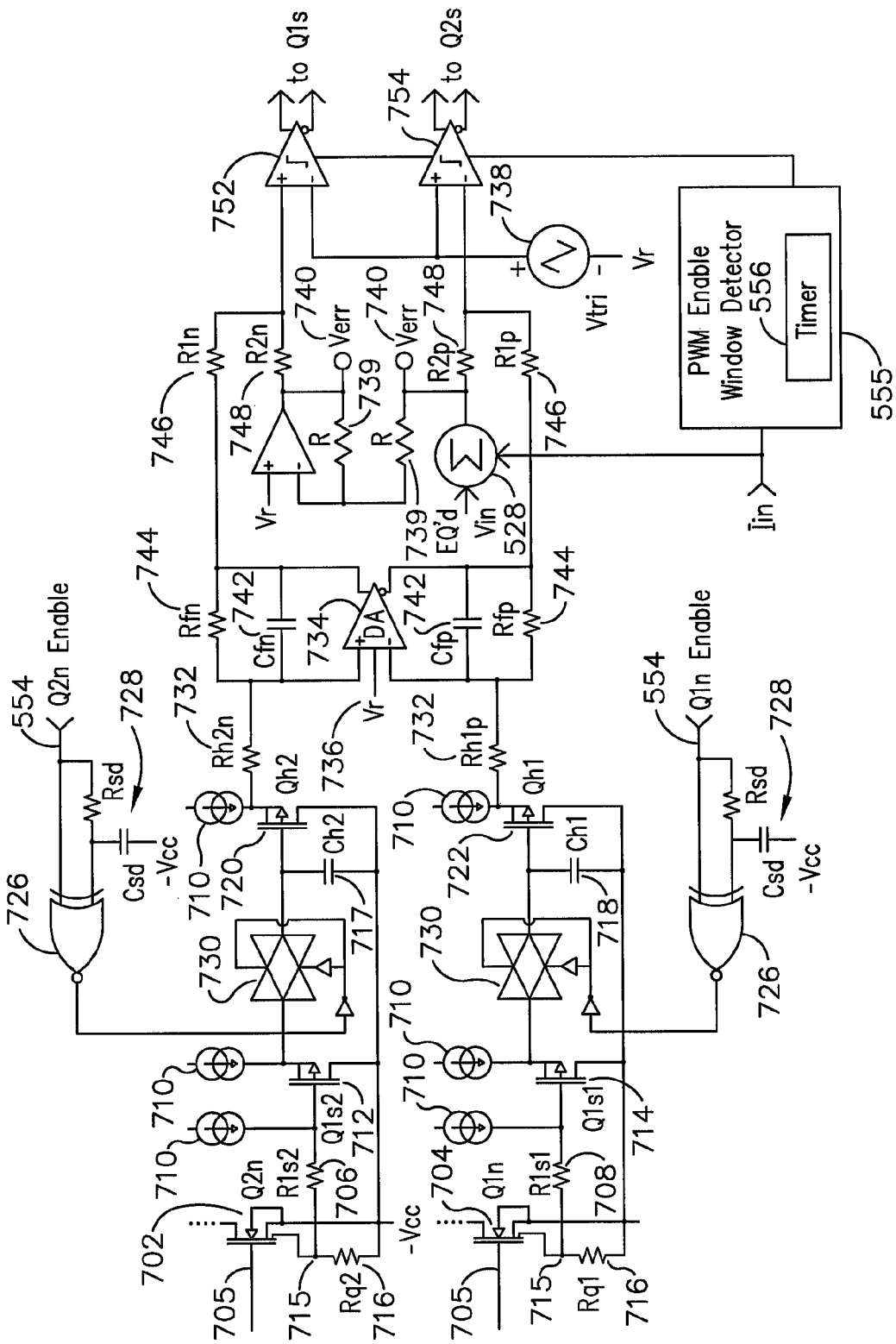
FIG. 7 is an example modulator for use with an interleaved N=2 switchmode audio amplifier.

FIG. 7 shows an example of a pulse width modulator operable as a PWM current balancing modulator in an amplifier having at least a switchmode output stage, such as a second output stage of an N=2 interleaved AB/D amplifier similar to FIG. 5. In other examples, the PWM current balancing modulator may be used in conjunction with any form of switchmode power converter.

In FIG. 7, the sense FET signals indicative of sensed current in the switching stages of the switchmode amplifier may be received from switches in the switchmode amplifier. The switches may be negative switches in each of the switching stages. In FIG. 7, the current balance signals indicative of sensed current may be received from a first negative switch (Q2n) 702 and a second negative switch (Q1n) 704, each of which are operating in a switching stage of the switch mode amplifier in response to switch control signals provided on switch control lines 705 from comparators 752 and 754. The current balance signals may first be level shifted sufficiently positive with a voltage across resistors $R_{lsx}$ 706 and 708 to allow a linear output from matched P-channel FET source followers $Q_{lsx}$ 712 and 714 supplied with current sources 710. The potential of the sense FET outputs at a sense node 715 can be, for example, over a volt below supply voltage –Vcc across a resistor Rqx 716 when free-wheeling is occurring. The level shifted sense FET outputs may be provided to the FET source followers $Q_{lsx}$ 712 and 714.

The outputs of the FET source followers $Q_{lsx}$ 712 and 714 may be held on capacitors $C_{hx}$ 717 and 718, and buffers $Q_{hx}$ 720 and 722 during the brief time intervals that are possibly body-diode recovery intervals. These intervals may be present during FET turn-on in a switching stage just after the free-wheeling current has been flowing into the opposed MOSFET switching device's body diode, as previously discussed. Such currents may flow when the load current has exceeded the ripple current and the free-wheeling current has been large enough to induce a voltage across the conduction channel of a MOSFET to forward bias the associated body diode. From the perspective of the low-side switching MOSFET this can occur when the low-side switching. MOSFET is being recovered from free-wheeling a large positive output current, or when the low-side switching MOSFET is having to recover the high-side switching MOSFET's body diode when the high-side switching MOSFET was free-wheeling a large negative output current.

Logic signals which drive switching of the low-side switching MOSFETs 702 and 704 within the respective switching stages may be used to selectively control use of the current balance information provided from the sense FET signals of the low-side switching MOSFETs 702 and 704. These logic signals may be edge detected using exclusive NOR (XNOR) gates 726 having an RC low-pass filter 728 cascaded with one input of the respective XNOR gate 726. The output of the XNOR gate 726 may pulse low (hold mode) following each edge of its input signal. Thus, since the logic signals provide an indication of the occurrence of a switching event, the shoot-thru current during the switching event may be ignored by holding the charge on capacitors $C_{hx}$ 717 and 718 for a predetermined time, such as about 200 nanoseconds. The input stage of the XNOR gate 726 may be designed with a logic threshold (differential pairs on each input) to allow the timings to be better controlled than would be available from a standard CMOS gate construction whose thresholds may not be well controlled. The output of the XNOR gates 726 may be provided to a source follower transfer gate 730. Upon activation, the source follower transfer gates 730 may provide the level shifted sense FET outputs to capacitors $C_{hx}$ 717 and 718, and buffers $Q_{hx}$ 720 and 722.

In the center of FIG. 7 is a differential amplifier (DA) 734 which receives the signals from the $Q_{1hx}$ buffers 720 and 722 that follow the voltage present on the $C_{hx}$ capacitors 717 and 718. The DA 734 may act to level shift its outputs to be balanced about a reference voltage level Vr 736 while providing low-pass gain to the voltage mismatch of the input signals supplied to the DA 734 via feed forward resistors 732. Reference voltage level $V_r$ 736 is the voltage to which a triangle generator 738 and the PWM current balance modulator are referenced. Since this form of amplifier may have split-rails (+/–Vcc) for its power stage, reference voltage level $V_r$ 736 may be either ground or a mid-point voltage to a ground referenced supply, such as a 5V supply. In other examples, other ranges of Vcc and Vr are possible. The operation of the DA 734 and associated circuitry may provide the current balance signals illustrated in FIGS. 5 and 6 on the current balance signal lines 522 and 622. In FIG. 7, only a fraction of the output voltage of the DA 734 may be needed to correct the Verr signals (–Verr and Verr) of the PWM current balance modulator across resistor R 739, which are present at the Verr nodes 740. Operation of the DA 734 may include noise control with capacitors Cfx 742 and feedback resistors 744. The low output impedance typical of a switchmode power stage in series with the output inductor impedance of the switchmode power stage means that only small differences in PWM width will be necessary to make corrections for current imbalance in the switching stages sensed using the balance signals. Therefore resistor R1x 746 may be much greater than resistor R2x 748 (R1x>>R2x) in a network that is used to inject the balance corrections using PWM comparators 752 and 754. In other examples, other forms of control are possible to balance the currents of switching stages. For example, in FIG. 7 the current balance signal from the one switching stage is compared to the other switching stage to substantially balance the switching stages. In other examples, the current balance signal from the switching stages may be averaged and used to balance each of the switching stages.

The output of PWM comparators 752 and 754 of the PWM current balance modulator may be enabled by the PWM enable window detector circuit 555. The PWM enable window detector 555 may receive an input current signal Iin, such as the output current of the first output stage. Alternatively, the PWM enable window detector 555 may receive a signal voltage of the input signal (Vin) 524, an output voltage of the first output stage 502, or any other signal indicative of the timing of switching of the switching stages. The PWM enable window detector 555 and the timer 556 may operate as previously discussed.

Not shown in FIG. 7 is a current limiter to protect the switchmode output stage from overcurrent conditions. The current limiter may operate such that when current limiting occurs within one PWM switching stage all paralleled interleaved switching stages are shut down, as well as the first output stage (if present). Accordingly, a switchmode stage current overload within any part of the second output stage may be treated as an overload of the amplifier. In an alternative example, portions of the amplifier may be temporarily disabled during an overcurrent condition in order to maintain at least some operation under such conditions.

Also not shown in FIG. 7 are the gate drivers and circuits which power the same. The gate drivers and circuits may be used to power the switches, or gates, in the switchmode output stage IC, such as a class-D IC. Matters of polarity are very flexible in FIG. 7 and whatever is needed can be accommodated.

Triangle waveform synthesis by the triangle generator 738 may be feed-forward to the PWM comparators 752 and 754 and include gain tracking where the level of the triangle waveform (Vtri) is determined by the magnitude of the Vcc power supplies. In fixed frequency applications an optimized form of triangle ramp control may omitted, whereas in variable frequency applications, optimized triangle ramp control may be implemented, for example as described in U.S. Pat. No. 7,557,622 to Gerald R. Stanley. Means to phase control each channel may also be provided so that multiple channels can be timed to all be switching in a uniformly phase-staggered manner (interleave), as previously discussed. This may minimize any electromagnetic interference (EMI) that is being created. In other examples, phase control of each channel may be omitted.

With reference to FIG. 5, clamping of the summing amplifier 528 that sums the processed input voltage (Vin) and, for example, the output current of the first output stage that drives the pulse width modulator may be omitted since it need not integrate or have any large amount of feedback used with the switchmode power stage. In other examples, such clamping may be implemented.

Figure 8:
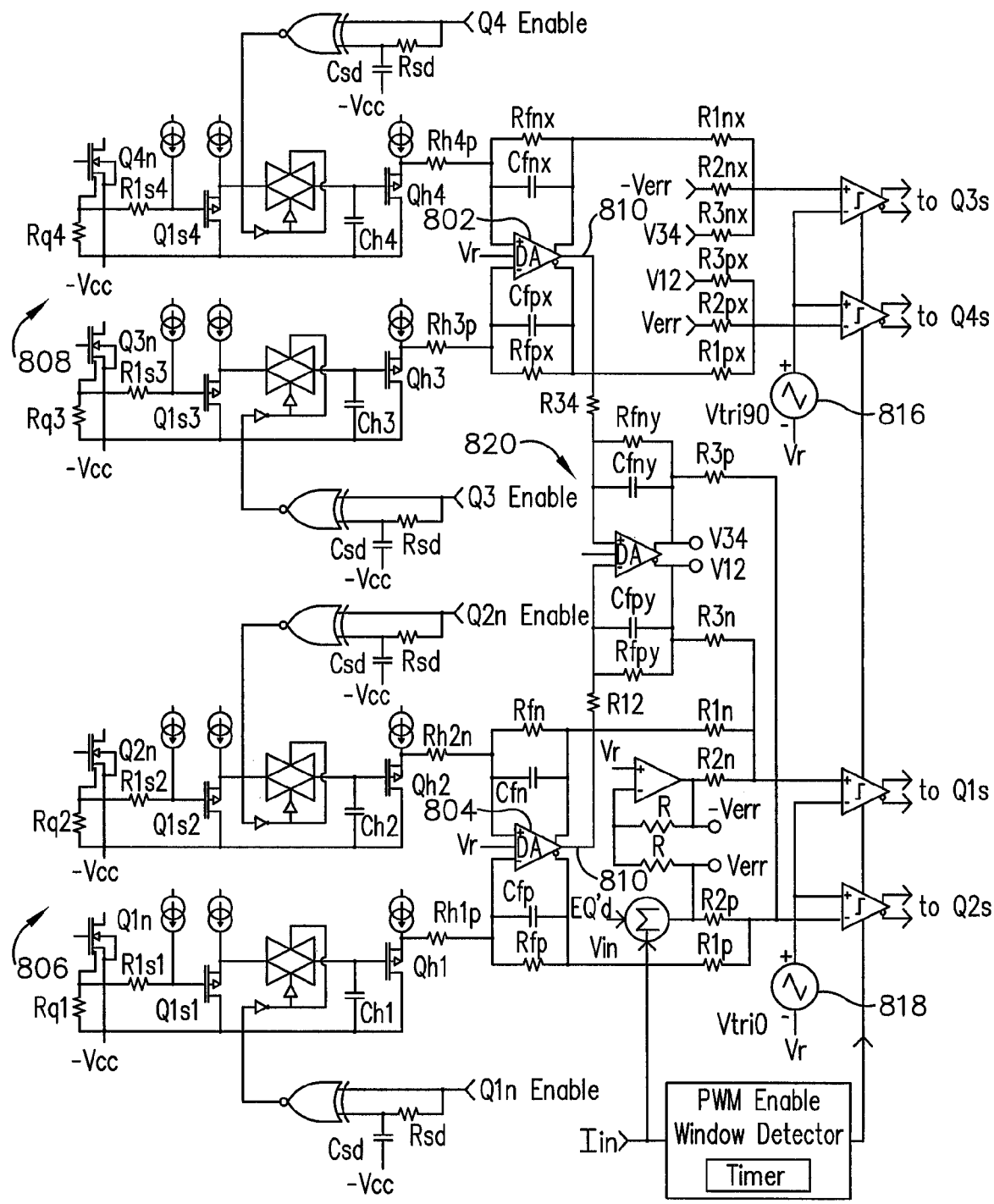
FIG. 8 is an example modulator for use with an interleaved N=4 switchmode audio amplifier.

FIG. 8 shows an example of a pulse width modulator for an N=4 output stage similar to that illustrated in the example of FIG. 6. Since the architecture is similar in many respects to FIG. 7, for purposes of brevity, mainly differences will be described. In FIG. 8 the differential amplifiers 802 and 804 that sense the imbalance between negative switch pairs 1 and 2 806, and negative switch pairs 3 and 4 808 of the switching stages each have a third output 810. This third output 810 is from a common mode eliminating servo. The common mode eliminating servo may eliminate the common mode signal in the output of each of the DAs 802 and 804 as described with reference to FIG. 7. The third output 810 from each of the differential amplifiers may be provided as an input to a differential amplifier 820. The differential amplifier 820 can operate to balance the pairs of switches in the output stages that include negative switch pairs 1 and 2 806, and negative switch pairs 3 and 4 808. Balancing of pairs of switches against pairs of switches using the differential amplifier 820 minimizes components in the circuitry. The difference between the common mode signal of the pairs is the needed correction (or error signal) to balance the currents between pairs. Accordingly, all of the switching stages of the second output stage may be balanced, since balancing the pairs of switches may result in substantially balancing all of the switching stages with respect to each other. In other examples, other balancing schemes are possible, such as obtaining and averaging the output currents from each of the switching stages, and then balancing each of the switching stages against the average to balance each of the switching stages.

The two triangle carriers 816 and 818 used in the N=4 modulator may be synthesized to not only assure that they are in quadrature but also to assure that they have matched amplitudes. A mismatch in triangle amplitudes may create an operational imbalance between the switching stage pairs. This may not be a difficult criterion for an ASIC design, however, it may be more difficult for a discrete design.

Disabling and enabling the switchmode output stage can be a matter of turning the switchmode output stage on and off "quietly," since the switchmode PWM output stage can be disabled based on an output signal provided from the first output stage, such as an AB stage, during startup and shutdown. An example goal would be to keep A-weighted peak noise levels below 3 mV worst-case.

A consideration in selecting between the N=2 and N=4 IC designs is the cost of the external inductors used in the output stages. It does not automatically follow that the cost of four quarter-size inductors used in an N=4 design is greater than two half-size inductors used in an N=2 design. An actual case study may be needed to make such a determination. If the manufacturing of the two half-size inductors can be fully automated then N=2 may be the lower cost approach. If the quarter-size can be fully automated and the half-size cannot, then N=4 may be the lower cost approach.

Which IC design has the greater pin count is also complicated by the ampacity allowance of each pin and whether or not deliberate redundancy of key pins is a design requirement. If the N=2 case had redundant output pins and the N=4 case did not, the output pin count portion would be invariant. That is not an unlikely situation since the N=4 case has less output current per cell. What probably does grow the pin count of the N=4 case is the possibility of a need for additional high-side gate driver bypass capacitors.

Amplifier diagnostics could be included that allow the output voltage and currents of both the first output stage and the second output stage to be observed by a built-in diagnostics system. Such a diagnostic system can make both direct and burst test conversions and report min/max/sum results to a host processor via a diagnostic system such as that described in U.S. Pat. No. 7,521,936 to Gerald R. Stanley. Overloads from clipping or current limiting could also be reported.

In the example where the amplifier is to be used as a current amplifier, one possible implementation assumes that a current regulation loop may be externally imposed without alteration of the voltage controlled amplifier. If this is not so, there may be additional design considerations with mode control to allow both current and voltage amplifier modes of operation. Typically the current amplifier mode requires a low-noise integrating feedback amplifier in the feedback loop that compares the input signal with a relatively small voltage sensed by a small value resistor in the ground return of the load. This small voltage may need to be first amplified with an additional low-noise amplifier. With voltage feedback the available feedback voltage from the output is large and needs to be attenuated, not amplified.

The current sensor for a current amplifier may be any form of current sensing device. In one example, the current sensor may be a grounded current sense resistor in the ground current return of the load driven by a half-bridge power stage. This is a low-cost high-performance form of current sensing when such a resistor is used in conjunction with a low-voltage, low noise bipolar input stage opamp to amplify the voltage across the resistor and possibly function as an integrating error amplifier for the control loop. Biasing the opamp input stage to high currents can provide input voltage noise levels that approach 1 nV/rt-Hz. An IC that integrates the current feedback for four or eight channels of a voltage amplifier using this current sensing system may be implemented. The power current sense resistors of the current sensing system may be external to the IC. Such an IC that includes the current sense system may be implemented in amplifiers other than an AB/D class amplifier and may be implemented with our without interleaved operation of the switching stages.

The output channel count of one example ASIC may be at least four channels assuming that the output is 5 A peak with a 34V peak capability when running from +/−35V rails (72 W@8 Ohms). In other examples, ASICs with additional or fewer channels are possible. For example, a two channel IC with the same per channel power capabilities as a larger four channel IC may make it easier to build six channel systems without wasting channels by implementing a four channel IC in combination with a two channel IC. If the same package could afford-ably be used by the two channel version, it would allow eight channel PCBs to be assembled as six channels, etc.

In other example implementations, higher or lower output current versions are envisioned. In a lower current version, the power supply voltage Vcc may remain +/−35V rails and the maximum output current may be reduced to 2.5Apk, such as, in a 16 Ohm output channel impedance amplifier, rather than an 8 Ohm output channel impedance amplifier. This would allow the same power supply to be shared amongst dissimilar sized channels. A higher output current version may be a 2 output channel amplifier similarly using a power supply voltage Vcc having +/−35V rails. In other example implementations, amplifiers implementing these designs may be placed in bridge mode in order to expand the application arena of possible products. For example, in one application, a bridge connection of two 10 A channels may result in a 290 W into an 8 Ohms amplifier.

Figure 9:
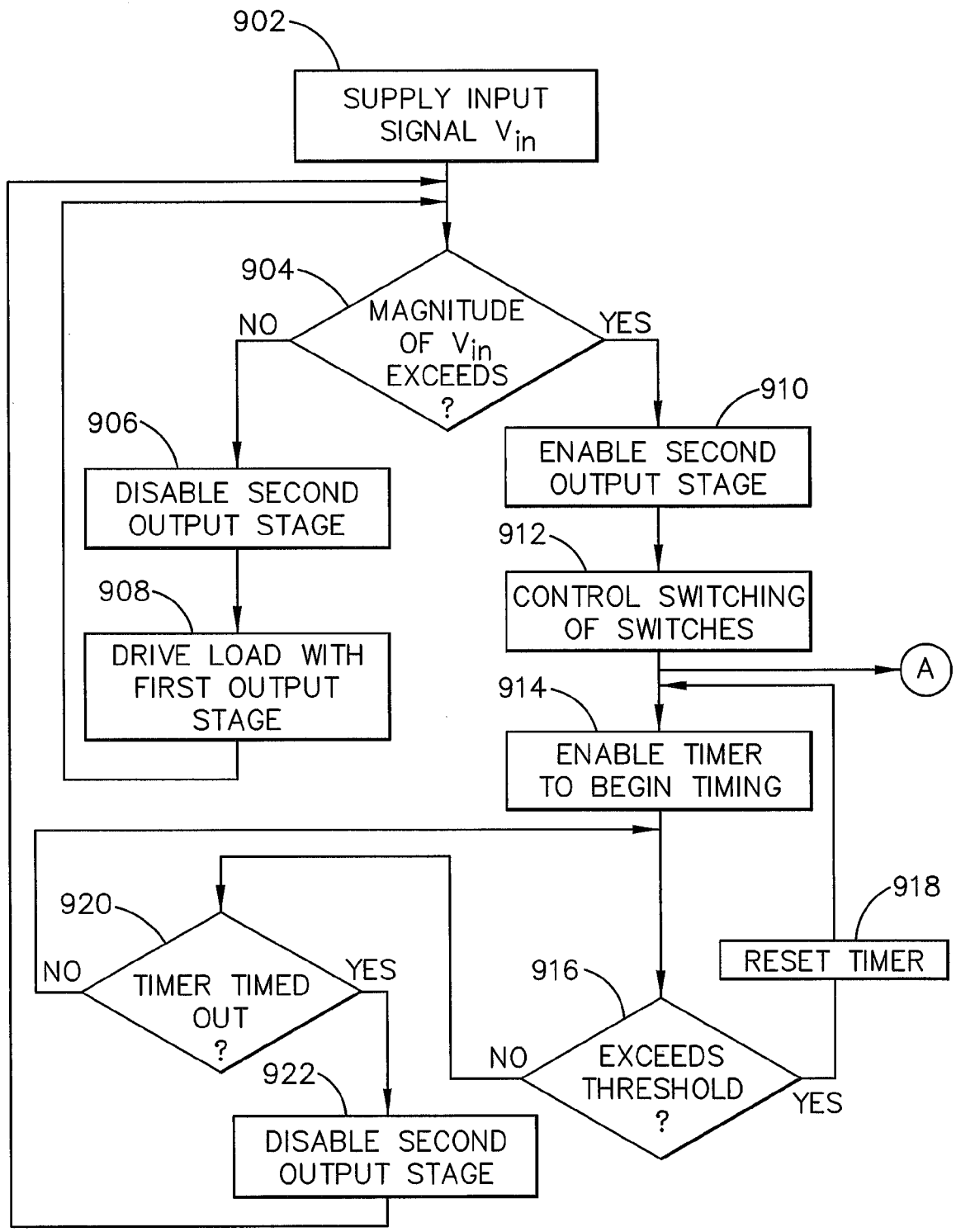
FIG. 9 is an example operational flow diagram of a high efficiency audio amplifier system.

FIG. 9 is an example of an operational block diagram of a high efficiency amplifier as described with reference to FIGS. 1-8. In FIG. 9, at block 902 an input signal Vin, such as an audio input signal, is supplied to a first output stage and a second output stage of the high efficiency amplifier. At block 904, it is determined by a pulse width modulator included in the second output stage if an operational parameter such as the magnitude of the input signal Vin, the output of the first output stage, or a demand from a load exceeds a predetermined threshold. If the input signal Vin, the output of the first output stage, or the demand from the load does not exceed the predetermined threshold, the second output stage is disabled by disabling the pulse width modulator at block 906. At block 908 the load is supplied an amplified output signal from only the first output stage, and the operation returns to block 904.

If, on the other hand, at block 904 the magnitude of the input signal Vin, the output of the first output stage, or the demand from the load exceeds the predetermined threshold, at block 910, the second output stage is enabled by enabling the pulse width modulator, and both the first output stage and the second output stage provide an amplified output signal to the load. The pulse width modulator of the second output stage controls a plurality of switches included in the second output stage to generate the amplified output signal at block 912. The amplified output signal of the second output stage may drive the load, such as a loudspeaker, and the amplified output signal of the first output stage may operate to filter the amplified output signal of the second output stage. The pulse width modulator of the second output stage may control the switching of the switches in accordance with a component of the output power of at least one of the first output stage and the second output stage.

In addition to enabling the second output stage, at block 914, a timer included in the second output stage is enabled and begins timing. At block 916, it is determined if an operational parameter such as a peak output of the first stage, a peak output of the input voltage Vin, or a peak demand from the load exceeds a predetermined magnitude. If the operational parameter exceeds the predetermined magnitude, at block 918, the timer is reset and the operation returns to block 914 to begin timing.

If, at block 916 it is determined that a peak output of the first output stage, a peak output of the input signal Vin, or a peak demand from the load does not exceed the predetermined magnitude, it is determined if the timer has timed out at block 920. If the timer has not timed out, the operation returns to block 916. If the timer has timed out at block 920, the second output stage is disabled at block 922, and the operation returns to block 904.

Figure 10:
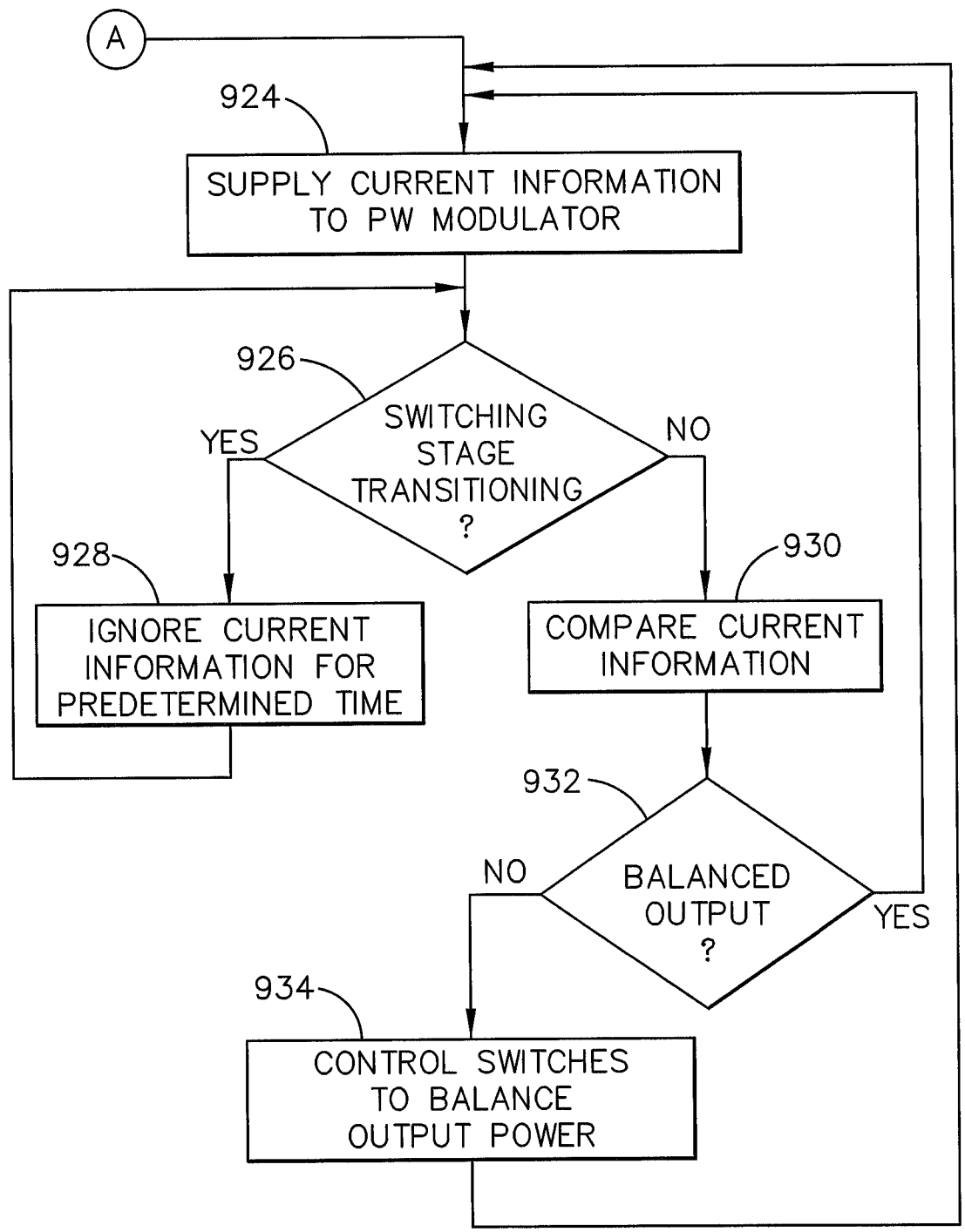
FIG. 10 is a second part of the example operational flow diagram of FIG. 9.

Returning to block 912, in FIG. 10, at block 924 current information is supplied from each of the switching stages to the pulse width modulator. The current information is supplied as a component of the output power of the second output stage. At block 926, it is determined if the any of the switching stages included in the second output stage are transitioning between conducting current with a positive switch and conducting current with a negative switch included in each of the switching stages. If the positive and negative switches are transitioning, the pulse width modulator ignores the current information from the switching stage that is transitioning for a predetermined period of time at block 928 and the operation then returns to block 926. Ignoring the current information to avoid including shoot through currents in the current information may involve buffering the current information from prior to commencement of the switching transition.

At block 926, after determining those switching stages that are not transitioning, the operation continues to block 930 and compares the current information of different switching stages. The pulse width modulator determines if the output power of the switching stages is substantially balanced at block 932 based on current information supplied from each of the switching stages. If the output power of the switching stages is substantially balanced, the operation returns to block 924 and receives additional current information from the switching stages. If the power output of the switching stages is not substantially balanced at block 932, the pulse width modulator controls the switches in the switching stages to balance the power output of the switching stages at block 934 and the operation returns to block 924. Operation of the second output stage to balance the output power of the switching stages may be performed separately and independent of enabling and disabling the second output stage. Accordingly, in some example operations either the enabling and disabling of the second output stage, or the balancing of the switching stages of the second output stage may be omitted from the functional operation of the second output stage. Moreover, the second output stage may operate to balance the output power of the switching stages in the absence of the first switching stage, as previously discussed.

A high efficiency audio amplifier system may include a first output stage cooperatively operating with a second output stage coupled in parallel with the first output stage to drive a load. The first output stage may be a linear amplifier that operates with relatively high efficiency to generate an amplified output power when the high efficiency amplifier system is under quiescent conditions, or lightly loaded. The second output stage may operate as a switchmode converter having a number of switching stages operated with interleave to minimize ripple current of amplified output power supplied from the second output stage.

As the load on the high efficiency audio amplifier increases, the second output stage may be enabled to supply amplified output power to the load. While the second output stage is supplying an amplified output to the load, the amplified output of the first output stage may perform as a filter of the amplified output of the second output stage. When the load on the high efficiency amplifier decreases below a predetermined threshold for a predetermined period of time, the second output stage may be disabled. Delaying disablement of the second output stage when the load decreases may avoid noticeable transitions when the second output stage is disabled.

The second output stage may include a number of switching stages. Each of the switching stages may be independently controlled by the second output stage to supply a part of the output power of the second output stage. The second output stage may monitor current information for each of the switching stages in order to control the switching stages to substantially balance the portion of the output power supplied from each of the switching stages. Each of the switching stages may include a positive switch and a negative switch, which are selectively transitioned between an open state and a closed state to control generation of the portion of the output power. During the transition time, the second output stage may disregard transient changes in the current information due to switching of the positive and negative switches. Accordingly, accuracy of the power output of the switching stages may be improved and the output power provided by each of the switching stages may be more effectively balanced.

While various embodiments of the invention have been described, it will be apparent to those of ordinary skill in the art that many more embodiments and implementations are possible within the scope of the invention.

I claim:

1. A high efficiency amplifier system comprising:
    a first output stage having at least two conductive devices operable to conduct continuously during greater than 50% of a duty cycle; and
    a second output stage coupled in parallel with the first output stage, the second output stage having a plurality of pairs of switches, and operable as a switchmode output stage operable with interleaved switching in which the pairs of switches are operable sequentially during a switching period;
    the first and second output stages cooperatively operable to supply a load, and
    the first output stage configured to selectively enable and disable operation of the second output stage in accordance with a determined threshold magnitude of an output current of the first output stage.

2. The high efficiency amplifier system of claim 1, further comprising a resettable timer, the resettable timer enabled to begin timing for a predetermined time at a time that the second output stage is enabled, the second output stage maintained as enabled for at least the predetermined time.

3. The high efficiency amplifier system of claim 2, where the resettable timer is configured to reset and again begin timing for the predetermined time in response to a predetermined peak output current of the first output stage.

4. The high efficiency amplifier system of claim 2, where the resettable timer is configured to reset and again begin timing for the predetermined time in response to a predetermined output current of the first output stage being exceeded for a predetermined period of time.

5. The high efficiency amplifier system of claim 2, where the resettable timer is configured to reset and again begin timing for the predetermined time in response to a predetermined magnitude of a demand signal of the load suppliable by the high efficiency amplifier system.

6. A high efficiency amplifier system comprising:
    a first output stage configured to output a first amplified signal amplified by the first output stage;
    a second output stage coupled in parallel with the first output stage, the second output stage configured to output a second amplified signal amplified by the second output stage;
    a pulse width modulator included in the second output stage; and
    a plurality of switches included in the second output stage and coupled with the pulse width modulator, the pulse width modulator operable to enable and disable the second output stage in accordance with a component of an output power of the first output stage;
    a current sensor configured to provide an output current signal indicative of an output current component of the output power of the first output stage, the second output stage configured to be selectively enabled and disabled based on a magnitude of the output current signal; and
    a summer operable to sum an input signal received by both the first output stage and the second output stage with the signal indicative of an output current signal, an output of the summer being a feed forward control signal provided to the pulse width modulator.

7. The high efficiency amplifier system of claim 6, where the pulse width modulator is operable to selectively enable and disable switching of the switches to enable and disable the second output stage.

8. The high efficiency amplifier system of claim 6, where the first output stage is configured to drive a load with the output power of the first output stage in a first predetermined range, and the second output stage is enabled by the pulse width modulator to drive the load with an output power of the second output stage in a second predetermined range that is greater than the first predetermined range.

9. The high efficiency amplifier system of claim 6, where the pulse width modulator is operable to selectively enable and disable switching of the switches based on either a voltage magnitude component or a current magnitude component of the output power of the first output stage to enable and disable the second output stage.

10. The high efficiency amplifier of claim 6, further comprising a resettable timer configured to provide a signal to disable the pulse width modulator in response to at least one of the voltage magnitude component or the current magnitude component of the output power of the first output stage being below a predetermined threshold for a predetermined period of time.

11. The high efficiency amplifier of claim 6, where the first output stage is operable as a class AB power converter, and the second output stage is operable as a switch mode output stage.

12. The high efficiency amplifier of claim 6, where the pulse width modulator is operable to operate the plurality of switches with interleaved switching in the switch mode output stage.

13. A method of operation of a high efficiency amplifier system, the method comprising:
    outputting a first amplified signal with a first output stage, the first amplified signal amplified by the first output stage;
    outputting a second amplified signal, the second amplified signal amplified by a second output stage coupled in parallel with the first output stage;
    controlling switching of a plurality of switches included in the second output stage with a pulse width modulator included in the second output stage to operate the switches with interleaved switching in which the pairs of switches are operable sequentially during a switching period; and
    enabling and disabling the second output stage in accordance with a predetermined threshold magnitude of an output current of the first output stage.

14. The method of claim 13, further comprising enabling and disabling switching of the switches with the pulse width modulator to enable and disable the second output stage.

15. The method of claim 14, where enabling and disabling the second output stage in accordance with a predetermined threshold comprises the pulse width modulator enabling and disabling the second output stage in accordance with a predetermined threshold of an output current component of the output power of the first output stage.

16. The method of claim 13, further comprising initiating timing with a resettable timer at a time when the second output stage is enabled, and disabling the second output stage when a predetermined time is reached with the resettable timer.

17. The method of claim 16, further comprising resetting and again initiating timing with the resettable timer any time an output current of the first output stage exceeds a predetermined threshold.

18. The method of claim 16, further comprising resetting and again initiating timing with the resettable timer any time a predetermined magnitude of a demand signal of the load suppliable by the high efficiency amplifier system exceeds a predetermined threshold.

19. The method of claim 16, further comprising and again initiating timing with the resettable timer any time an output current of the first amplified signal output by the first output stage exceeds a predetermined output current for a predetermined period of time.

* * * * *